United States Patent [19]
Kuroda et al.

[11] 4,432,091
[45] Feb. 14, 1984

[54] SEMICONDUCTOR LASER DEVICE

[75] Inventors: Takao Kuroda, Kokubunji; Takashi Kajimura, Hachioji; Yasutoshi Kashiwada, Hinodemachi; Naoki Chinone, Hachioji; Kunio Aiki, Takasaki; Jun-ichi Umeda, Hachioji, all of Japan

[73] Assignee: Hitachi, Ltd., Tokyo, Japan

[21] Appl. No.: 342,357

[22] Filed: Jan. 25, 1982

[30] Foreign Application Priority Data

Feb. 6, 1981 [JP] Japan ............................ 56-15743

[51] Int. Cl.³ .............................................. H01S 3/19
[52] U.S. Cl. ........................................ 372/45; 357/17; 372/48
[58] Field of Search ................... 372/44, 45, 46, 48; 357/17

[56] References Cited
U.S. PATENT DOCUMENTS

| | | | |
|---|---|---|---|
| 4,063,189 | 12/1977 | Scifres et al. | 372/45 |
| 4,251,780 | 2/1981 | Scifres et al. | 372/45 |
| 4,323,856 | 4/1982 | de Waard | 372/46 |

*Primary Examiner*—James W. Davie
*Attorney, Agent, or Firm*—Kenyon & Kenyon

[57] ABSTRACT

In a semiconductor laser device having at least a first semiconductor layer, second and third semiconductor layers which are formed in a manner to sandwich the first semiconductor layer and which have a wider band gap and a lower refractive index than those of the first semiconductor layer, an optical resonator and carrier injection means; a semiconductor laser device characterized in that at least said first semiconductor layer has an angle of inclination ($\theta$) relative to an axis which is perpendicular to optically flat faces constituting said optical resonator. The inclination angle $\theta$ (rad) should most preferably lie in a range of:

$$\frac{\theta_z - \theta_c}{2} \leq \theta \leq \frac{W}{l}$$

where $\theta_z$ denotes a reflection angle, $\theta_c$ a critical angle, $W\frac{1}{2}$ of a thickness of a waveguide, and $l$ a cavity length. The laser device is effective for preventing laser facets from breaking down, and can produce high power.

3 Claims, 12 Drawing Figures

SEMICONDUCTOR LASER DEVICE

BACKGROUND OF THE INVENTION

1. Field of the Invention

This invention relates to a semiconductor laser device, and is particularly effective when applied to a semiconductor laser having a double-hetero structure.

2. Description of the Prior Art

Semiconductor lasers have been put into practical use for optical communication, an optical disk, a laser beam printer, etc., and have become increasingly important from both the aspects of the performance and economy of each system. In order to achieve enhancements in functions, such as realization of a high operating speed, in the future, developments have been put forward for the increase of laser power.

With the present-day GaAlAs/GaAs-based semiconductor laser, a power of about 15 mW is the limit in practical use as regards the room-temperature continuous-wave (cw) oscillation element whose mode is controlled to the fundamental mode. The reason is that when the element is operated at high power, thermal damages occur in the radiation emitting and reflecting planes of a laser resonator (usually, the cleavage planes of a crystal) to degrade the characteristics of the element.

As a measure for improving such laser facet damages, there has been adopted a method in which the element is protected by covering the facets with dielectric films of $Al_2O_3$, $SiO_2$ or the like. As an alternative method, it has been proposed to fabricate the laser in the structure according to which the vicinities of the facets become transparent to laser radiation. An example of this laser is one disclosed in Japanese Patent Application Publication No. 55-27474 wherein a Zn diffusion region reaching an active layer is disposed in only the central part of a resonator without forming any diffusion region near the facets. In this example, the region in which laser emission takes place has, in effect, the band gap ($E_g$) narrowed as compared with that in the vicinities of the facets because the diffusion of Zn gives rise to emission transition between the conduction band and the acceptor level of Zn. This is equivalent to the form in which the facets are protected by transparent members.

However, the following are mentioned as the difficulties of these structures:

(1) In the fabrication, the diffusion front (diffusion depth, width, etc.) needs to be precisely controlled by the Zn diffusion process.

(2) Since any light waveguiding mechanism for transverse modes is not existent near the facets, an output beam is attended with astigmatism. Accordingly, a correcting optical system needs to be installed for utilizing the output beam.

SUMMARY OF THE INVENTION

An object of this invention is to eliminate the disadvantages described above, and to provide a semiconductor laser whose emission facets are not damaged and which can afford a beam of high quality and high power.

The construction of this invention for accomplishing the object consists in that an active layer has a predetermined angle of inclination relative to cleavage planes for emitting radiation.

Laser radiation during the operation of a laser device is repeatedly transmitted within a substantial optical waveguide passage (hereinbelow, abbreviated to "W.G.") composed of an active layer, clad layers etc. and then emerges from the cleavage planes into emitted laser radiation. The inclination angle $\theta$ signifies that the active layer inclines $\theta$ (rad) with respect to an axis perpendicular to the radiation emitting facet, and that the angle $\theta$ falls within a range satisfying at least the following expression:

$$\frac{\theta_z - \theta_c}{2} \leq \theta \leq \frac{\pi - \theta_z - \theta_c}{2}$$

Here, when considered in approximation to geometrical optics, $\theta_z$ denotes the angle of reflection of resonant laser radiation from the wall surface of the W.G., the radiation moving zigzag within the W.G. (hereinbelow, simply termed the "reflection angle"), and $\theta_c$ denotes the critical angle. The angle $\theta_z$ has a value which is uniquely determined by the wavelength ($\lambda$) of the laser radiation, the respective refraction indices $n_a$ and $n_e$ of the active layer and the clad layer, and the thickness d of the active layer. The angle $\theta_c$ has a value which is uniquely determined by the wavelength ($\lambda$) and the refractive indices $n_a$ and $n_c$. That is:

$$\theta_z = \tan^{-1}\left(\frac{\beta}{h}\right)$$

where $\beta$: propagation constant in a traveling direction, h: propagation constant in a direction perpendicular to the traveling direction, ($\beta$ and h are determined by the characteristic equation of the dielectric waveguide passage when $\lambda$, $n_a$, $n_e$ and d are properly selected), and $$\theta_c = \sin^{-1}\left(\frac{n_e}{n_a}\right).$$

As stated above, according to this invention, the optic axis perpendicular to the facet and the active layer are not parallel but incline $\theta$, so that part of the resonant laser radiation leaks. Then, the peak of a radiation distribution shifts in accordance with the radiation leakage. As a result, the emission laser radiation does not emerge, at least, from the center of the facet of the active layer, but it emerges with the center of the radiation distribution located at that position of the facet of the clad layer which deviates from the active layer slightly above or below.

In this manner, in the laser radiation-emitting facet, the emission laser radiation emerges from the position different from the center of the active layer. Therefore, the region which produces heat due to the absorption of the radiation and the region which emits the radiation are positionally separated, and a heavy thermal load on the active layer is avoided. Accordingly, no facet damage occurs, and a laser beam of high power can be obtained. As will be described later, emission in the shape of a spot close to a true circle is attained under the influence of the inclination angle.

BRIEF DESCRIPTION OF THE DRAWINGS

FIG. 3a is a sectional view of a laser device showing an embodiment of this invention and taken along a plane parallel to the traveling direction of laser radiation, while

DETAILED DESCRIPTION OF THE INVENTION

Figure 1A:
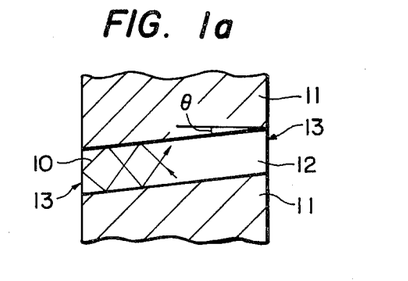
FIGS. 1a and 1b and FIGS. 2a and 2b are diagrams for explaining the principles of this invention.
Figure 1B:
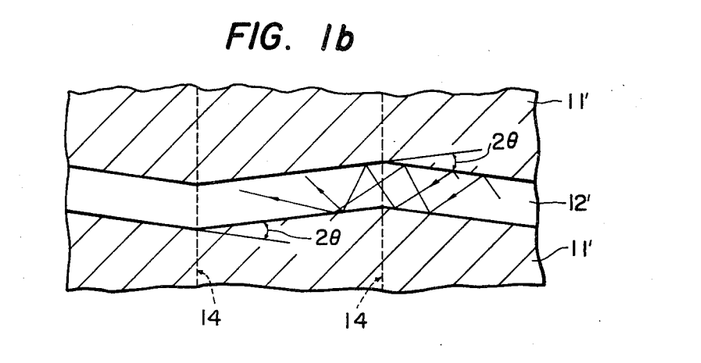

The situation of the propagation of radiation inside a semiconductor laser device according to this invention is simulated as shown in FIGS. 1a and 1b. FIG. 1a is a sectional view of an optical confinement region, while FIG. 1b is an optically equivalent constructional view thereof. An active layer 12 is formed in a clad region 11, and resonant laser radiation 10 is reciprocating between optically flat faces 13 and at a predetermined angle of reflection during operation. Ordinarily, the aforecited W.G. is constructed of the three layers o a clad layer, the active layer and a clad layer. A method of constructing the clad layers and the active layer is quite the same as in the prior-art semiconductor laser having the double-hetero structure. The clad layer may well be constructed of two or more layers as in the so-called large optical cavity. Of course, a construction having other semiconductor layers can also be adopted properly for a purpose, and the present invention is applied thereto. This will be described later. The W.G. is slant $\theta$ relative to the optically flat faces 13. Since the resonant laser radiation is reflected, the active layer 12 can be said equivalent to a W.G. 12' which bends in the shape of saw teeth with respect to the laser radiation as shown in FIG. 1b. Parts 11' are clad layers. That is, the active layer 12 can be deemed to bend like saw teeth half infinitely when the optically flat faces 13 are replaced with planes of symmetry 14.

Figure 2A:
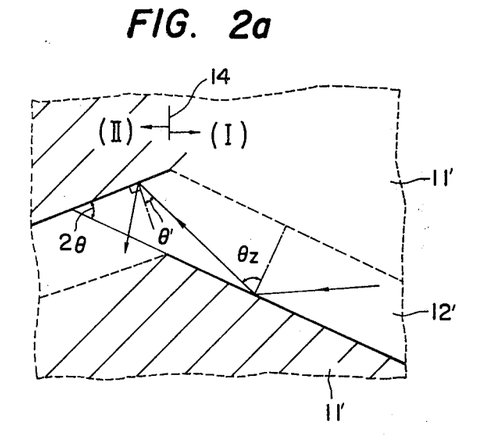
Figure 2B:
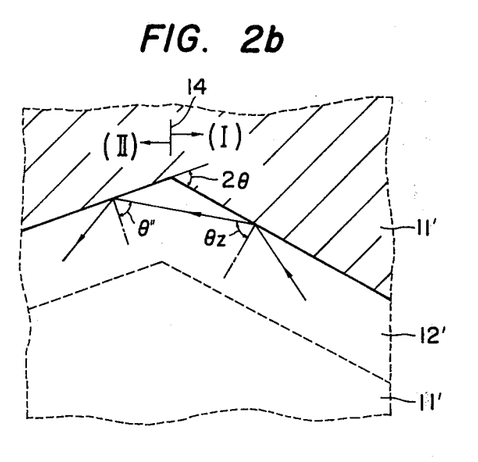

Accordingly, in studying the optical characteristics, such as the quantity of the laser radiation, of the laser device having the bent W.G., the states of the reflections of two sorts of radiations may be considered. FIGS. 2a and 2b depict the states. The radiation to be first considered is the radiation which is reflected to the opposite surface as from the lower surface to the upper surface (or vice versa) near the plane of symmetry 14 as illustrated in the equivalent constructional view of FIG. 2a. When the radiation having been reflected at an angle $\theta_z$ from the lower surface of the W.G. in a region (I) is reflected at an angle $\theta'$ from the upper surface of the W.G. in a region (II), $$2\theta + \left(\frac{\pi}{2} + \theta'\right) + \left(\frac{\pi}{2} - \theta_z\right) = \pi$$

holds. Accordingly, when $$\theta' = \theta_z - 2\theta$$

is smaller than the critical angle $\theta_c$ of the W.G., the radiation can be caused to penetrate out of the W.G. That is, when $$\theta \geq \frac{\theta_z - \theta_c}{2} \quad (1)$$

holds, the radiation can be caused to leak from the W.G. In order to separate the propagated radiation from the unnecessary leakage radiation by the opposite surface, $\theta$ needs to be greater than the right-hand side of Expression (1). The second radiation to be considered is the radiation which is reflected to the surface on the identical side as from the upper surface to the upper surface (quite similarly, from the lower surface to the lower surface) near the plane of symmetry 14 as illustrated in the equivalent constructional view of FIG. 2b. In this case, when the radiation having been reflected at the angle $\theta_z$ from the upper surface of the W.G. in the region (I) is reflected at an angle $\theta''$ from the upper surface of the W.G. in the region (II), $$\left(\frac{\pi}{2} - \theta_z\right) + (\pi - 2\theta) + \left(\frac{\pi}{2} - \theta''\right) = \pi$$

holds. Accordingly, when $$\theta'' = \pi - \theta_z - 2\theta$$

is smaller than the critical angle $\theta_c$ of the W.G., the radiation penetrates out of the W.G. That is, when $$\theta > \frac{\pi - \theta_z - \theta_c}{2} \quad (2)$$

holds, the radiation penetrates without being reflected.

Accordingly, in order to prevent the propagated radiation from penetrating into the non-transmitting region of the region (II), $\theta$ needs to be smaller than the right-hand side of Expression (2). In other words, $\theta$ is also a critical angle for the repeated resonance of the laser radiation.

Thus, $\theta$ is given from Expressions (1) and (2):

$$\frac{\pi - \theta_z - \theta_c}{2} \geq \theta \geq \frac{\theta_z - \theta_c}{2} \quad (3)$$

by fulfilling this condition, it is possible to leak the radiation in the first case and to confine the radiation in the second case. That is, in the first case, part of the quantity of the resonant laser radiation is separated from the unnecessary leakage radiation, while in the second case, the remaining part of the quantity of the resonant laser radiation is used as the necessary radiation. In the facet emitting the laser radiation, accordingly, the filament region of the laser radiation can be prevented from concentrating on a fixed region, and any thermal damage can be avoided.

Radiation which comes into incidence on the lower surface of the region (II) from the upper surface of the region (I) in FIG. 2a or FIG. 2b does not usually appear under lasing conditions.

In this invention, it is favorable to set the upper limit of the gradient of the inclination angle $\theta$ at W/l. Here, W denotes ½ of the thickness of the W.G., and l denotes the cavity length. This measure is effective for moderating the inclination gradient of the W.G. and for checking the absorption of even the necessary radiation due to the impingement or touch of the resonant laser radiation against or with the non-transmitting region, for example, a GaAs substrate. It brings forth the advantage that laser radiation of high quality is obtained. Hereunder, the invention will be described in detail in connection with embodiments.

Figure 3A:
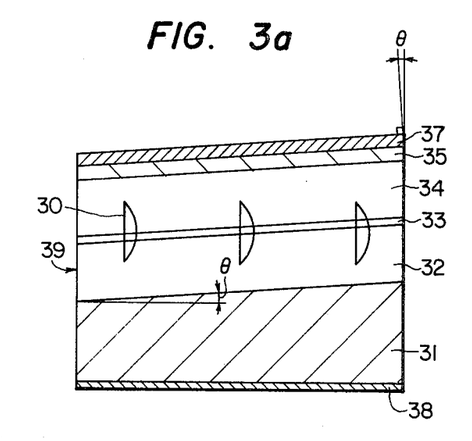

FIG. 3a is a schematic sectional view of a semiconductor laser embodying the present invention as taken along the traveling direction of laser radiation.

A GaAs substrate 31 of the n-conductivity type having a predetermined plane is overlaid with a clad layer 32 which is made of n-Ga$_{1-x}$Al$_x$As (0.2≦x≦0.7) and which is 1.0–5.0 μm thick. The layer 32 is overlaid with an active layer 33 which is made of Ga$_{1-y}$Al$_y$As (0≦y≦0.35) and which is 0.03–0.20 μm thick. The layer 33 is overlaid with a clad layer 34 which is made of p-Ga$_{1-x}$Al$_x$As (0.2≦x≦0.7) and which is 1.0–5.0 μm thick. If necessary, a cap layer 35 made of p-GaAs and being about 1 μm thick may well be disposed on the layer 34, or a cap layer 35 having current paths of p-conductivity type regions (not shown) in selected parts of the n-GaAs layer may well be disposed. An insulating film 36 having an electrode window (usually, in the shape of a stripe) is disposed on the layer 34 or 35, and metal electrodes 37 and 38 are respectively disposed on the film 36 and the rear surface of the substrate 31. Thus, the semiconductor laser is constructed. Further, using the cleavage of the crystal, the reflection planes of a resonator are formed.

In the present embodiment, the crystal face of the substrate 31 is the (100) plane having an inclination angle θ in the crystallographic (011) direction (in general, it is also said that the "off" angle is θ with respect to the (100) plane). It is important that the crystal face inclines the angle θ in the (011) direction being the traveling direction of radiation and that it does not incline in the direction perpendicular to the above-mentioned direction. In this example, the inclination angle θ lies in a range of 0.281°–26.22°. In case of utilizing the cleavage planes of the crystal as the reflection planes, the crystal face of the substrate 31 is usually made the (100) plane having the inclination angle θ (or a plane equivalent thereto). However, when the resonator is constructed of means other than the cleavage planes, another selection is of course possible. For example, the (111) plane is usable.

With the above inclination, the inclination of the front surface of the substrate 31 relative to optically flat faces 39 is naturally expressed by (π/2±θ. Hereunder, unless particularly specified, the word "inclination" shall signify one expressed with reference to the emergent beam axis of the emitted laser radiation.

Since such semiconductor layers as the clad layers 32 and 34, the active layer 33 and the cap layer 35 are formed by the layered crystal growth on the substrate, they all have the inclination angles θ.

In practical use, the inclination angle θ is properly designed according to a purpose, depending upon the wavelength of the laser radiation, the thickness of the active layer and the refractive indices of the respective semiconductor layers. Ordinarily, the inclination angle θ is brought into a range of at least 0.110° and at most 26.53°. In constructing a semiconductor laser in practical use, θ is selected preferably from within a range of at most 5°, more preferably at most 2°. When the thickness of the active layer is made 0.03–0.20 μm, the inclination angle can be used in a range of 0.110°–23.20° for 0.03 μm. For the active layer thickness of 0.20 μm, the inclination angle can be used in a range of 0.285–26.53°. The situation is quite similar when the thickness of the active layer has a value intermediate between 0.03 and 0.20 μm. Accordingly, the inclination angle is selected within the range of 0.110°–26.53°. These will be tabulated. Table 1 concerns an example of an infrared laser in which the oscillation wavelength λ=0.83 μm, the AlAs mole fraction of the clad layer X=0.37, the refractive index of the active layer $n_a$=3.6673, the refractive index of the clad layer $n_e$=3.3698 and the critical angle $$\theta_c = \sin^{-1}\left(\frac{n_e}{n_a}\right) = 66.76°.$$

TABLE 1

| Thickness of Active Layer d (μm) | Angle of Reflection $\theta_z$ (deg) | $\dfrac{180° - \theta_z - \theta_c}{2}$ | $\dfrac{\theta_z - \theta_c}{2}$ |
| --- | --- | --- | --- |
| 0.03 | 66.93 | 23.20° | 0.110° |
| 0.04 | 67.32 | 23.00 | 0.281 |
| 0.05 | 67.61 | 22.82 | 0.425 |
| 0.06 | 67.95 | 22.60 | 0.595 |
| 0.07 | 68.32 | 22.43 | 0.780 |
| 0.08 | 68.72 | 22.26 | 0.980 |
| 0.10 | 69.40 | 21.95 | 1.248 |

Table 2 concerns an example of a visible laser in which λ=0.78 μm, the mole fraction X=0.55, $n_a$=3.6874, $n_e$=3.2870 and $\theta_c$=63.05°.

TABLE 2

| Thickness of Active Layer d (μm) | Angle of Reflection $\theta_z$ (deg) | $\dfrac{180° - \theta_z - \theta_c}{2}$ | $\dfrac{\theta_z - \theta_c}{2}$ |
| --- | --- | --- | --- |
| 0.02 | 63.10° | 26.72° | 0.025° |
| 0.03 | 63.62 | 26.53 | 0.285 |
| 0.04 | 64.03 | 26.33 | 0.490 |
| 0.05 | 64.52 | 26.22 | 0.735 |
| 0.06 | 65.07 | 26.00 | 1.010 |
| 0.07 | 65.66 | 25.81 | 1.305 |
| 0.08 | 66.10 | 25.60 | 1.520 |
| 0.10 | 67.08 | 25.20 | 2.055 |

In the foregoing embodiment, the light intensity distribution (radiation distribution) 30 of the resonant laser radiation is as shown in FIG. 3a. In the central part of the laser resonator, the active layer and the peak of the radiation distribution agree, but near the facets 39, the light intensities in the parts of the active layer decrease and the laser radiation comes to exist in the substantially transparent GaAlAs clad layers 32 and 34. Therefore, the self-absorption of light in the vicinities of the facets is reduced, and light of high power is obtained.

Figure 4:
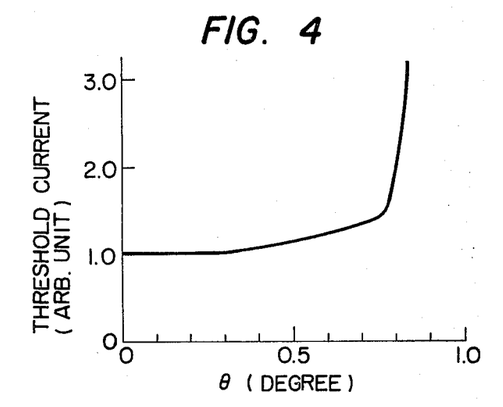
FIGS. 4, 5 and 6 are graphs showing examples of the relationships between the angle of inclination ($\theta$) of an active layer and the threshold current, far field angle and catastrophic failure limit of a laser device, respectively.
Figure 5:
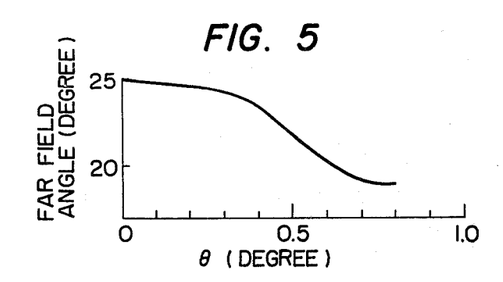
Figure 6:
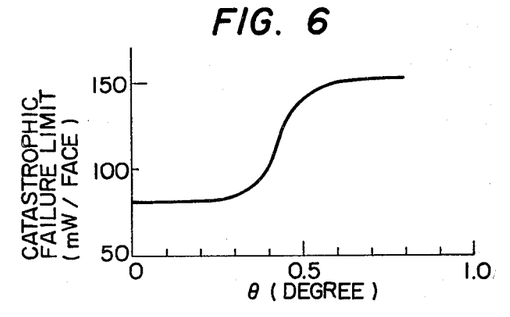

FIGS. 4, 5 and 6 illustrate the relationships between the inclination angle (θ) and the threshold current, far field angle and catastrophic failure limit, respectively. The construction of the pertinent semiconductor laser is an example in which the oscillation wavelength λ=0.83 μm, the AlAs mole fraction of the clad layer x=0.37, the thickness of the active layer is 0.05 μm, the thickness of each clad layer is 2.0 μm, the refractive index of the active layer $n_a$=3.6673, the refraction index of the clad layer $n_c$=3.3698 and the cavity length is 150 μm. In this example, $(\theta_z-\theta_c)/2$ is 0.425 (degree), and W/l is 0.764 (degree).

As seen from FIG. 6, the catastrophic failure limit rises abruptly from 0.425 (degree) in terms of the inclination angle $\theta$. This indicates that a light output face capable of enduring high power has been obtained.

In this example, W/l becomes 0.764 (degree), and the threshold current begins to rise with an inclination angle value with which the W/l value is exceeded. This is ascribable to the fact that part of the laser radiation is absorbed by the GaAs substrate or the cap layer of GaAs. As stated before, the upper-limit value of the favorable inclination angle ($\theta$) is varied by varying the thickness of the optical waveguide passage. The inclination angle ($\theta$), however, does not exceed $(\pi - \theta_z - \theta_c)/2$.

Figure 3B:
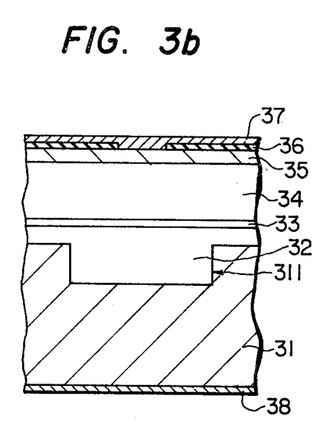
FIG. 3b is a sectional view of the laser device seen from the emission facet of the laser radiation.

In the foregoing embodiment, it is better to provide a stripe groove in the substrate 31 as shown in FIG. 3b, because the laser radiation resonates in correspondence with the groove and a laser radiation of high quality with uniform transverse modes is obtained. In general, a laser which has a stripe-like groove or a rise (usually, a mesa portion) in a substrate and which has an active layer on the substrate is called the "channel substrate planar type laser (CSP laser)". Such CSP laser affords good optical characteristics free from astigmatism. Hereunder, it will be concretely described. Symbols in FIG. 3b are the same as in FIG. 3a.

A stripe groove 311 which is rectangular in section is formed on an n-GaAs substrate 31. The front surface of the substrate 31 is the (100) plane having an "off" angle, and the groove 311 is formed in a manner to extend in the (110) direction. The groove is etched with sulfuric acid, an alcoholic solution containing halogen, or the like through an insulating film mask having a predetermined pattern as disposed on the surface of the substrate 31. It is needless to say that, since the etching speed differs depending upon crystal planes, a groove of desired sectional shape is readily obtained by properly selecting the kind and composition ratio of a crystal, an etchant etc. Regarding the dimensions of the groove, the groove width is 4-10 $\mu$m, and the groove depth is 1-3 $\mu$m. Subsequently, the substrate 31 having the groove 311 is overlaid by the liquid epitaxy with a clad layer 32 which is 1-3 $\mu$m thick in the groove part 311 and 0.1-1.0 $\mu$m thick outside the groove. The liquid epitaxy is ordinarily carried out in a high-temperature atmosphere of 700°-850° C. and by the use of the so-called slide jig made of graphite. A solution for the liquid epitaxy consists, for example, of 4 gr. of Ga, 4-10 mg. of Al, 200 mg. of GaAs and 0.1-0.3 mg. of Te. Subsequently, an active layer 33 is formed on the clad layer 32 by the liquid epitaxy. A solution consists, for example, of 4 gr. of Ga, 0-10 mg. of Al and 200 mg. of GaAs (undoped). The active layer 33 has a substantially uniform thickness and is formed to be flat and horizontal. At the next step, a clad layer 34 is formed on the active layer 33 by the liquid epitaxy. A solution consists, for example, of 4 gr. of Ga, 4-10 mg. of Al, 200 mg. of GaAs and 10-30 mg. of Zn. Next, a cap layer 35 is formed on the clad layer 34 by the liquid epitaxy. A solution consists, for example, of 1,000 mg. of Sn, 4 gr. of Ga and 200 mg. of GaAs. Subsequently, the cap layer 35 is overlaid with an oxide film 36 which has an electrode window in a position corresponding to the groove 311. The oxide film may be formed by the conventional CVD process, and after forming a film, the window is formed by the known photolithography. It is a matter of course that the oxide film is not restrictive, but that another insulating film such as nitride film may well be used. Needless to say, the cap layer 35 may well be provided with a diffused region of a p-conductivity type impurity (not shown) in correspondence with the position of the groove 311. Subsequently, a p-conductivity type electrode 37 made up of two layers of Cr and Au is formed in a manner to cover at least the electrode window. Subsequently, an n-conductivity type electrode 38 made of an Au-Ge alloy is formed on the rear surface of the substrate 31. Then, the semiconductor laser is finished up.

Figure 7:
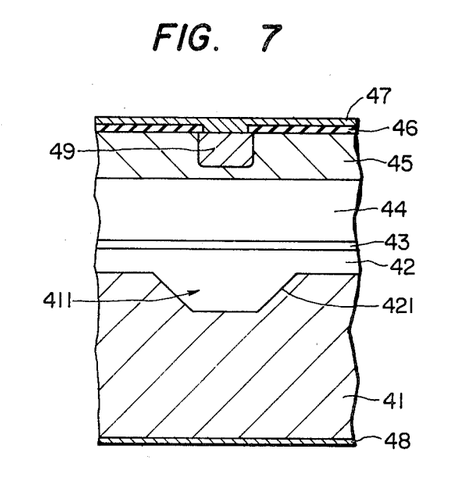
FIGS. 7 and 8 are sectional views of laser devices each showing another embodiment of this invention and seen from the emission facet of laser radiation.

FIG. 7 is a schematic sectional view of a semiconductor laser which is another embodiment of this invention. Since this embodiment is basically the same as in the case of the foregoing embodiment in FIGS. 3a and 3b, the points of difference will be chiefly described.

In FIG. 7, a substrate 41, clad layers 42 and 44, an active layer 43, a cap layer 45, an insulating film 46, and electrodes 47 and 48 correspond to the respective parts in the foregoing embodiment. Here, a groove 411 is a stripe groove in the shape of an inverted trapezoid. The embodiment is a GaAlAs CSP laser at a wavelength of 830 nm, in which the AlAs mole fraction x of the clad layers 42 and 44 is 0.37 and the thickness of the active layer 43 is 0.04 $\mu$m and which is formed by the conventional liquid epitaxial process. The substrate 41 employed for the growth is doped with Si at $2 \times 10^{18}$ cm$^{-3}$, and is inclined an angle $\theta = 0.5°$ in the (011) direction from the (100) plane. Ordinarily, the substrate is inclined 0.3°-2° in lasers of this type. The inclination is restrained within 2 minutes in the direction perpendicular to the stripe electrode or the traveling direction of radiation. Now, letting l denote the resonator length (usually, cavity length) of the laser, the spread of the laser radiation on the cleavage plane becomes l ($\mu$m) $\times \theta$ (rad) $\simeq$ 2.5 $\mu$m. Therefore, if the sum of the thicknesses of the p-type and n-type clad layers 42 and 44 is sufficiently greater than the aforecited value, the light is not absorbed by the non-transmitting regions such as the substrate 41 and the GaAs cap layer 45. In consequence, the optical output whose upper limit has heretofore been 30 mW in the cw oscillation can be raised up to about 60 mW being double higher. In this case, since the radiation distribution sufficiently overlaps the active layer 43 in the central part of the laser, the threshold current can be suppressed to about 70 mA nearly equal to the magnitude in the prior art. Owing to the CPS laser structure, the operation is held in the transverse fundamental mode, and astigmatism is hardly involved.

Figure 8:
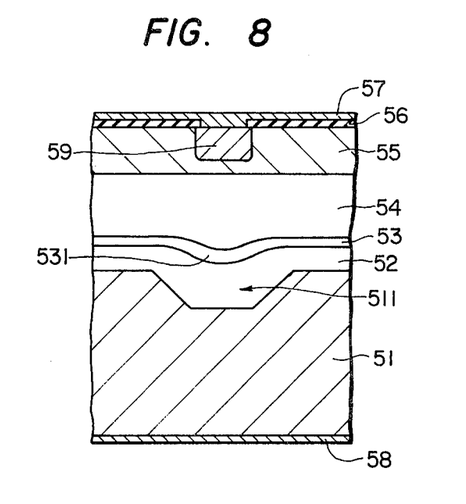

FIG. 8 is a schematic sectional view of a semiconductor laser which is still another embodiment of this invention. Since the embodiment of FIG. 8 is basically the same as in the case of FIG. 7, the points of difference will be chiefly described. In FIG. 8, a substrate 51, clad layers 52 and 54, an active layer 53, a cap layer 55, an insulating film 56, electrodes 57 and 58, a diffusion region 59 and a stripe groove 511 correspond to the respective parts of the embodiment in FIG. 7. Here, the active layer 53 has a curved part 531 which corresponds to the groove 511. In the laser having the curved part 531, the effective index difference in the lateral direction corresponding to the shoulders of the groove becomes small. Therefore, the laser has the advantage that laser radiation emitted in the curved part is made uniform in the single fundamental mode and that a high optical output is attained.

Figure 9:
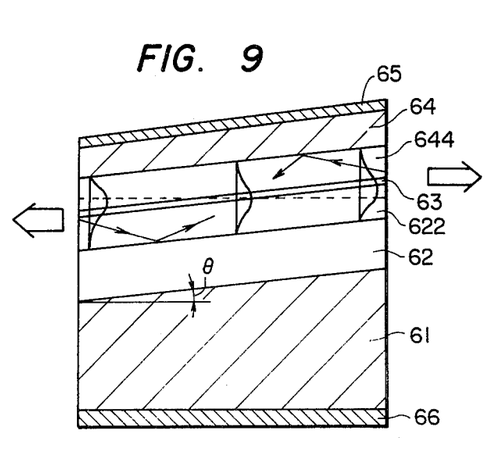
FIG. 9 is a sectional view of a laser device showing another embodiment and taken along a plane parallel to the traveling direction of laser radiation.

FIG. 9 is a schematic sectional view of a semiconductor laser which is still another embodiment of this invention. Since the embodiment of FIG. 9 is basically the same as in the case of FIG. 3a, the points of difference will be chiefly described. In FIG. 9, a substrate 61, clad layers 62 and 64, an active layer 63 and a cap layer 65 correspond to the respective regions in the foregoing embodiment of FIG. 3a. The present embodiment is made the so-called large optical cavity in such a way that light waveguiding layers 622 and 644 of somewhat higher refractive index are interposed between the respective clad layers 62 and 64 and the active layer 63. Usually, in case of an oscillation wavelength of 0.83 μm, the refractive index of the light waveguiding layers 622 and 644 is selected from within a range of 3.3698–3.6673, and in case of an oscillation wavelength of 0.78 μm, it is selected from within a range of 3.2870–3.6874. The constituent material of the light waveguiding layers is $Ga_{1-z}Al_zAs$ (0.20≦z≦0.30), and the thickness thereof is about 1 μm. The AlAs mole fraction z should desirably lie in the relationship of:

$$x < z < y$$

where x denotes the mole fraction of the active layer and y the mole fraction of the clad layer. In this embodiment, as illustrated in the figure, even light in the foot of the radiation distribution not used in the foregoing embodiment is guided back and can be fully utilized owing to the mode conversion of the laser radiation at each facet, so that the threshold current lowers down to about 60 mA. In addition, the light distribution on the facet is stabilized owing to the waveguiding passages 622 and 644.

Although the embodiments described above are the so-called double-hetero type lasers, the invention was similarly applicable to single-hetero type lasers. Also, it was quite similarly applicable to buried type lasers (usually, BH lasers). Of course, it was quite similarly applicable to cases where the materials of the substrate and the semiconductor layers were other semiconductor materials such as GaAlAs, InP and InGaAsP.

What is claimed is:

1. In a semiconductor laser device having at least a first semiconductor layer, second and third semiconductor layers which are formed in a manner to sandwich the first semiconductor layer and which have a wider band gap and a lower refractive index than those of the first semiconductor layer, an optical resonator and carrier injection means; a semiconductor laser device characterized in that at least said first semiconductor layer has an angle of inclination relative to an axis which is perpendicular to optically flat faces constituting said optical resonator.

2. A semiconductor laser device according to claim 1, characterized in that the inclination angle $\theta$ (rad) is selected at least from within a range of:

$$\frac{\theta_z - \theta_c}{2} \leq \theta \leq \frac{\pi - \theta_z - \theta_c}{2}$$

where $\theta_z$ denotes a reflection angle of laser radiation within an equivalent waveguiding passage, and $\theta_c$ denotes a critical angle.

3. A semiconductor laser device according to claim 2, characterized in that said angle $\theta$ (rad) is selected from within a range of:

$$\theta \leq \frac{W}{l}$$

where W denotes ½ of a thickness of the light waveguiding passage, and l denotes a cavity length.

* * * * *